United States Patent
De Souza

(10) Patent No.: US 9,502,501 B2
(45) Date of Patent: Nov. 22, 2016

(54) LATERAL FIELD EFFECT TRANSISTOR DEVICE

(71) Applicant: ROLLS-ROYCE PLC, London (GB)

(72) Inventor: Priyanka De Souza, Cambridge (GB)

(73) Assignee: ROLLS-ROYCE PLC, London (GB)

(*) Notice: Subject to any disclaimer, the term of this patent is extended or adjusted under 35 U.S.C. 154(b) by 0 days.

(21) Appl. No.: 14/884,572

(22) Filed: Oct. 15, 2015

(65) Prior Publication Data

US 2016/0118461 A1    Apr. 28, 2016

(30) Foreign Application Priority Data

Oct. 22, 2014   (GB) .................................. 1418752.0

(51) Int. Cl.
| | |
|---|---|
| H01L 29/06 | (2006.01) |
| H01L 29/417 | (2006.01) |
| H01L 29/423 | (2006.01) |
| H01L 29/08 | (2006.01) |
| H01L 29/78 | (2006.01) |
| H01L 29/778 | (2006.01) |

(52) U.S. Cl.
CPC ....... *H01L 29/0696* (2013.01); *H01L 29/0869* (2013.01); *H01L 29/0886* (2013.01); *H01L 29/41758* (2013.01); *H01L 29/4238* (2013.01); *H01L 29/7825* (2013.01); *H01L 29/778* (2013.01)

(58) Field of Classification Search
CPC .................................................. H01L 29/0696
See application file for complete search history.

(56) References Cited

U.S. PATENT DOCUMENTS

| | | | | |
|---|---|---|---|---|
| 4,636,825 | A | | 1/1987 | Baynes |
| 5,192,989 | A | | 3/1993 | Matsushita et al. |
| 5,355,008 | A | * | 10/1994 | Moyer ................ H01L 23/4824 257/341 |
| 5,517,046 | A | * | 5/1996 | Hsing ................ H01L 23/4824 257/336 |
| 5,682,048 | A | | 10/1997 | Shinohara et al. |
| 5,808,330 | A | * | 9/1998 | Rostoker ............. G06F 17/5072 257/204 |
| 5,852,315 | A | * | 12/1998 | Ker ..................... H01L 27/0266 257/350 |

(Continued)

FOREIGN PATENT DOCUMENTS

| | | |
|---|---|---|
| JP | S60-53085 A | 3/1985 |
| WO | 96/10267 A1 | 4/1996 |
| WO | 2011/014951 A1 | 2/2011 |

OTHER PUBLICATIONS

Mar. 3, 2016 Search Report issued in European Patent Application No. 15189933.

(Continued)

*Primary Examiner* — Eugene Lee
(74) *Attorney, Agent, or Firm* — Oliff PLC

(57) ABSTRACT

A lateral field effect transistor device has a plurality of source and drain cells. Each source cell has a central semiconductor source region, and each drain cell has a central semiconductor drain region. The device has a first metallic conductive path which extends from a source electrode to join the source regions, thereby connecting the source cells in series to the source electrode. The device has a second metallic conductive path which extends from a drain electrode to join the drain regions, thereby connecting the drain cells in series to the drain electrode. The device has a gate path which extends from a gate electrode around the edges of the cells to form boundaries between neighboring source and drain cells, thereby forming respective field effect transistors between the source and drain regions of neighboring cells. The source cells and drain cells tessellate to cover an area of the device.

14 Claims, 3 Drawing Sheets

(56) References Cited

U.S. PATENT DOCUMENTS

| | | | | |
|---|---|---|---|---|
| 6,140,687 | A * | 10/2000 | Shimomura | H01L 23/4824 257/390 |
| 6,737,714 | B2 * | 5/2004 | Masuda | H01L 27/0207 257/390 |
| 7,851,872 | B2 * | 12/2010 | Sutardja | H01L 21/76816 257/401 |
| 8,487,377 | B2 * | 7/2013 | Yu | H01L 29/0696 257/342 |
| 8,791,508 | B2 * | 7/2014 | Roberts | H01L 29/41725 257/200 |
| 2007/0032063 | A1 | 2/2007 | Sutardja | |
| 2007/0215939 | A1 | 9/2007 | Xu et al. | |
| 2011/0186858 | A1 * | 8/2011 | Roberts | H01L 29/205 257/76 |
| 2013/0095650 | A1 | 4/2013 | Shimomura | |
| 2014/0353736 | A1 * | 12/2014 | Tanimoto | H01L 29/41758 257/288 |

OTHER PUBLICATIONS

Mar. 23, 2015 Search Report issued in British Patent Application No. 1418752.0.

* cited by examiner

FIG. 3A
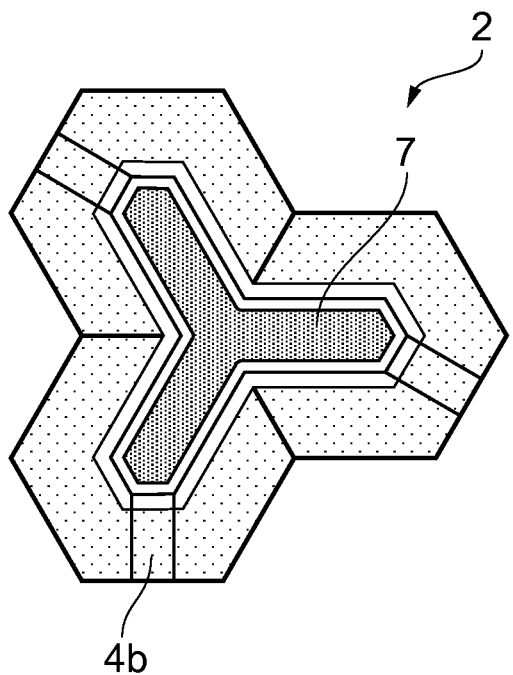
FIG. 3B
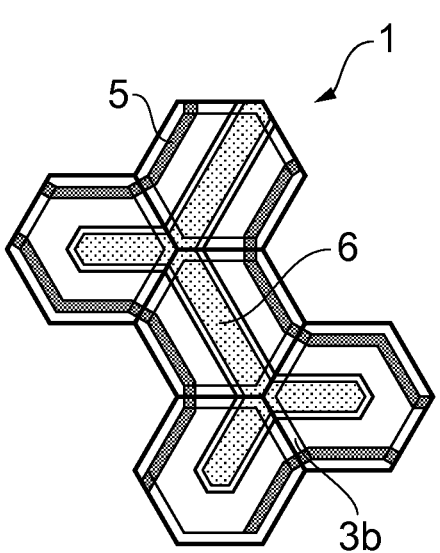
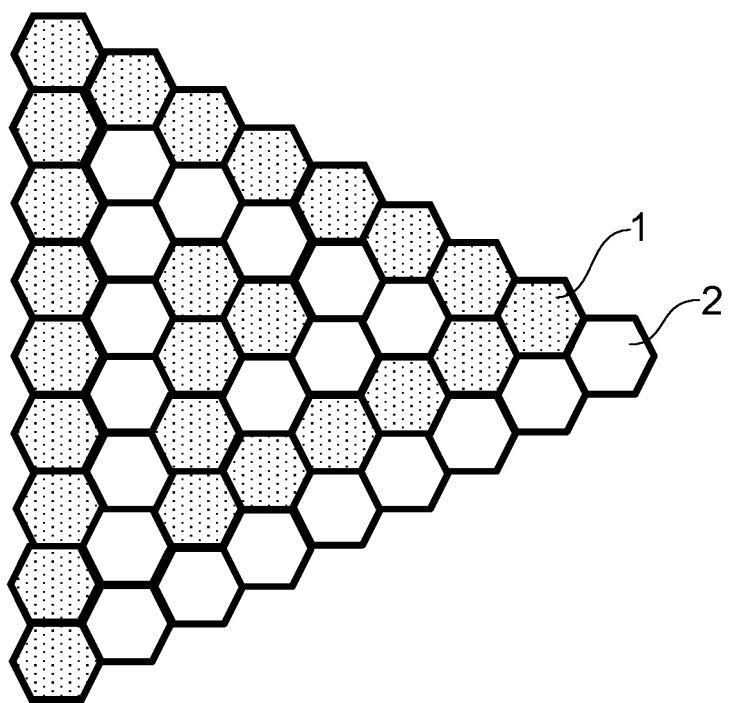
FIG. 4

LATERAL FIELD EFFECT TRANSISTOR DEVICE

FIELD OF THE INVENTION

The present invention relates to a lateral field effect transistor device.

BACKGROUND OF THE INVENTION

Conventional lateral field effect transistor devices can be of "multi-finger" or "serpentine" form.

In both cases, the source regions are formed as long, thin fingers, which interdigitate with drain regions also formed as long, thin fingers. The source regions extend from source electrodes, and the drain regions extend from drain electrodes. In the multi-finger device, plural gate regions in the form of fingers extend from gate electrodes, each gate region interposing between a source region and a neighbouring drain region. In contrast, in the serpentine device, each gate region extends from a gate electrode to snake around the boundaries between plural neighbouring source and drain regions.

A problem with these conventional devices is that increasing the current rating of the device requires an increase in the lengths and number of the source and drain fingers, which in turn increases resistive and inductive losses.

SUMMARY OF THE INVENTION

It would be desirable to provide a lateral field effect transistor device which can be scaled to different current ratings without increasing resistive losses and inductive effects to the same extent.

Accordingly, the present invention provides a lateral field effect transistor device having:
 a plurality of source cells and a plurality of drain cells, each source cell having a central semiconductor source region, and each drain cell having a central semiconductor drain region,
 a first metallic conductive path which extends from a source electrode to join the source regions of the source cells, thereby connecting the source cells in series to the source electrode,
 a second metallic conductive path which extends from a drain electrode to join the drain regions of the drain cells, thereby connecting the drain cells in series to the drain electrode, and
 a gate path which extends from a gate electrode around the edges of the cells to form boundaries between neighbouring source and drain cells, thereby forming respective field effect transistors between the source and drain regions of neighbouring cells;
 wherein the source cells and drain cells tessellate to cover an area of the device.

Advantageously, by tessellating the source and drain cells and connecting the cells by respective conductive paths, increasing the current rating of the device can be achieved simply by adding more cells. Additionally or alternatively, a plurality of such devices can be readily tessellated to increase the combined current rating of the devices. The increases in resistive and inductive losses caused by increasing the size of the device and/or number of devices in these ways are reduced relative to the increases that would occur by increasing the size of the conventional "multi-finger" or "serpentine" devices. In particular, in relation to adding more cells, much of the increase in length in any given series row of cells is by the conductive paths connecting the cells rather than by the semiconductor regions themselves, and the conductive paths can be of much lower resistance than the semiconductor regions. Further, tessellating plural conventional devices can significantly increase gate lengths, causing greater risks of failure points, and can lead to undesirably high currents at various locations.

Optional features of the invention will now be set out. These are applicable singly or in any combination with any aspect of the invention.

The source and drain cells are preferably relatively small compared to the size of the tessellated area. Adding individual further pairs of source and drain cells does not, therefore, produce large jumps in current rating, but rather arbitrary increases and decreases in current rating can be achieved by addition or subtraction of suitable numbers of cells. For example, along any given direction in the plane of the tessellated area of the device, each source and drain cell may extend no further than 20%, or preferably no further than 10% or 5%, of the maximum extent of the tessellated area in that direction.

In the plane of the tessellated area of the device, the source and drain cells may have an aspect ratio of no more than 5:1, and preferably no more than 3:1 or 2:1. By having an aspect ratio that is close to 1:1, anisotropy of the tessellated area can be reduced, allowing arbitrary increases and decreases in current rating to be achieved by changing the shape or size of the tessellated area in any direction. In contrast, the conventional multi-finger and serpentine devices are highly anisotropic, whereby increasing the width or length of the area of the device has a different effect on the performance of the device. By "aspect ratio" of a cell we mean the ratio of the longest diameter of the cell to the shortest diameter of the cell. Thus a hexagonal cell has an aspect ratio of 1.15:1.

In the plane of the tessellated area of the device, the source and drain cells may be shaped such that the gate path zig-zags around the edges of the cells. Such a zig-zagging path can help to increase the gate length per source region and the gate length per drain region.

Preferably, in the plane of the tessellated area of the device, the source and drain cells are substantially hexagonal-shaped. Such a shape facilitates close-packing of the cells within the tessellated area, and promotes a highly zig-zagged gate path. Also a hexagonal shape can facilitate scaling by the tessellation of plural devices. In particular, if the tessellated devices also form a hexagon, a "recursive" arrangement comprising "hexagons within hexagons within a hexagon" can be achieved, similarly recursive arrangements not being achievable with the conventional serpentine or multi-finger device.

The gate path may be a buried gate path.

Each of the first and second conductive paths may include branched paths which connect their respective cells in multiple series rows to their respective electrode. In this way, multiple parallel current paths can be formed, helping to avoid single points of failure in the device. This is in contrast to conventional serpentine and multi-finger devices, where single points of failure are inherent, and scaling by increasing the area of such a device only increases the problem.

The first and second conductive paths may be buried paths.

The device may have plural first conductive paths which each extends from a respective source electrode to join the source regions of a respective portion of the source cells, and may further have plural second conductive paths which each extends from a respective drain electrode to join the drain regions of a respective portion of the drain cells. Thus there can be multiple source electrodes and multiple drain electrodes in the device. In this case, plural gate paths may extend from the gate electrode, each gate path forming boundaries between a respective portion of the neighbouring source and drain cells. For example, the source and drain electrodes may be spaced around the boundary of the tessellated area, and the gate electrode may be centrally positioned in the tessellated area. Such a device may have a hexagonal-shaped tessellated area. Conveniently, three source electrodes and three drain electrodes can then alternate around the vertices of the tessellated area. The conductive path of each source electrode can then join the source regions of a respective third of the source cells, and similarly the conductive path of each drain electrode can then join the drain regions of a respective third of the drain cells.

The device may be a high electron mobility transistor device.

BRIEF DESCRIPTION OF THE DRAWINGS

Embodiments of the invention will now be described by way of example with reference to the accompanying drawings in which:

FIG. 3A-3B shows schematically variant forms of 3A a drain cell, and 3B a source cell; and FIG. 4 shows schematically a variant arrangement of cells in a lateral field effect transistor device.

DETAILED DESCRIPTION AND FURTHER OPTIONAL FEATURES OF THE INVENTION

Figure 1:
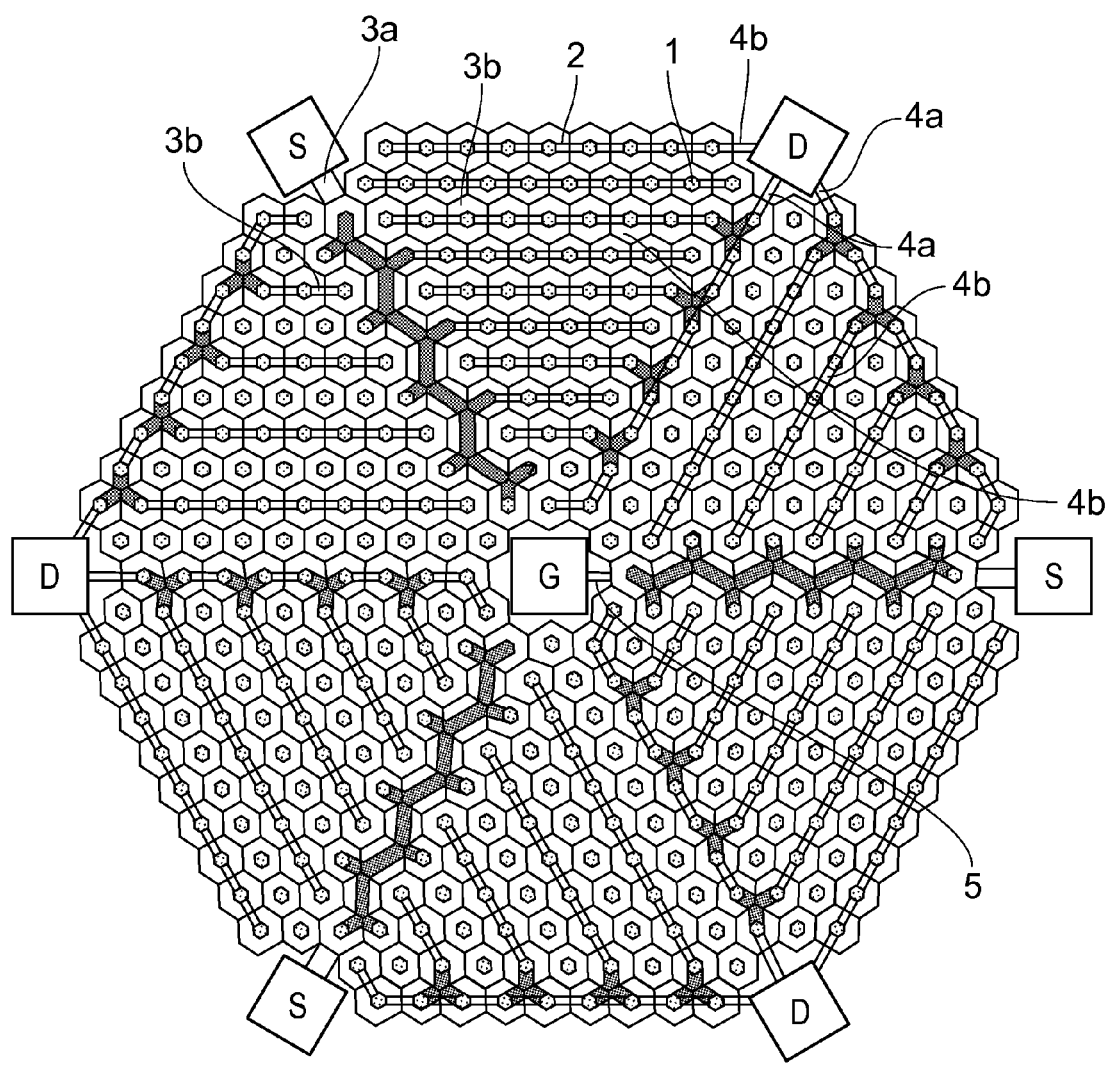
FIG. 1 shows a schematic image of a high electron mobility transistor device according to an embodiment of the present invention.

FIG. 1 shows a schematic image of a high electron mobility transistor device according to an embodiment of the present invention. A large hexagonal area of the device is covered by a close-packed array of tessellating smaller hexagonal source cells 1 and drain cells 2. At three of the vertices of the large hexagonal area are three source electrode pads S for the source cells, and at the other three vertices of the large hexagonal area are three drain electrode pads D for the drain cells. The source and drain electrodes alternate around the perimeter of the large hexagonal area. The electrode pads are in the form of stud bumps. The ability to tessellate the cells offers the ability to create a high current device on a single wafer.

A buried first metal conductive path extends from each source electrode S to join the source cells 1 in series to the source electrode. Each first path has a main branch 3a, and five side branches 3b at each side of the main branch, the side branches joining respective rows of source cells in series.

Similarly, a buried second metal conductive path extends from each drain electrode D to join the drain cells 2 in series to the drain electrode. The second path has two main branches 4a and one side branch 4b extending from the drain electrode. The side branch joins an outer row of drain cells in series. The other two main branches each have five further side branches 4b at one side thereof, the further side branches joining respective rows of drain cells in series.

The large number of side-branches 3b, 4b provides multiple parallel current paths, helping to avoid single points of failure At the centre of the large hexagonal area is a gate electrode pad G. Six buried gate paths extend from the gate electrode to zig-zag around the boundaries between neighbouring source 1 and drain 2 cells in six respective triangular regions of the large hexagonal area, thereby forming respective field effect transistors.

Figure 2A:
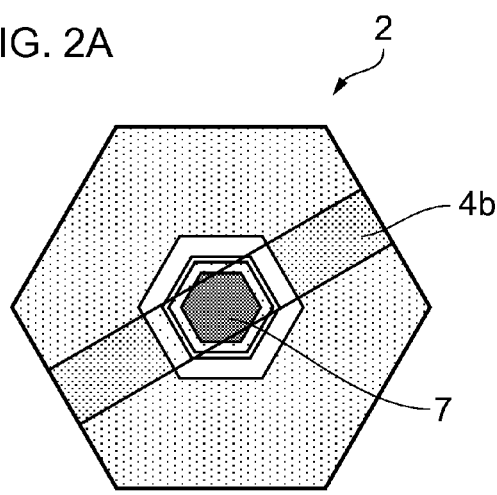
FIG. 2A-2D shows schematically 2A a drain cell, 2B a source cell, 2C a terminating cell drain cell, and 2D a terminating source cell for the device FIG. 3A-3B.
Figure 2B:
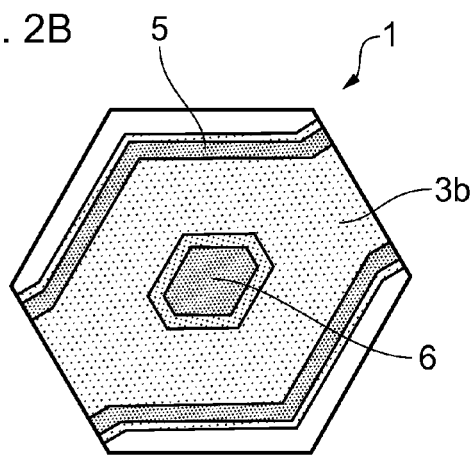
Figure 2C:
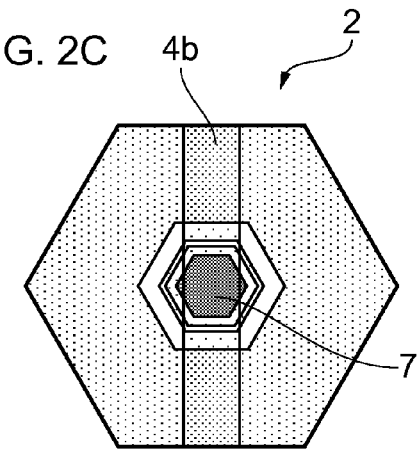
Figure 2D:
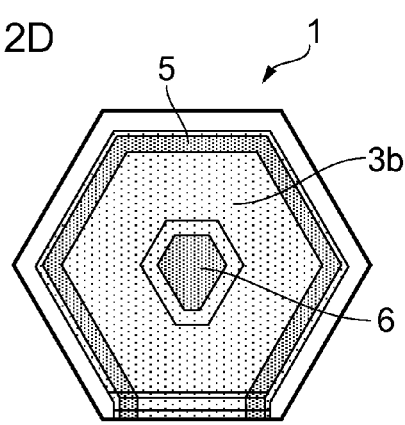

FIG. 2A-2D shows schematically, for the device of FIG. 1, 2A a drain cell 1, 2B a source cell 2, 2C a terminating drain cell at the end of a series row of cells, and 2D a termining source cell at the end of a series row of cells. Each source cell has a central semiconductor source region 6, and each drain cell has a central semiconductor drain region 7. The buried gate path 5 is shown at the boundary of the source cells, although of course the tessellation of the cells causes the gate path also to be at the boundary of the drain cells. The zig-zag shape of the gate path, which produces a high gate length per source region and a high gate length per drain region, is evident. The side-branches 3b and 4b of the buried first and second metal conductive paths travel across the cells to connect the semiconductor regions of neighbouring source cells and the semiconductor regions of neighbouring drain cells in respective series rows.

Being substantially hexagonal-shaped, the source 1 and drain 2 cells can be close-packed within the large hexagonal area of the device. Further, as the aspect ratio of a hexagon is only 1.15:1, the device is substantially anisotropic, whereby changing the size of the tessellated area in any direction has similar effects on device performance. This makes the device highly scalable.

In addition, the diameter of any given cell 1, 2 is only about 50 μm, in contrast with the width of the large hexagonal area, which at its greatest is 1451 μm, and at its lowest is 1306 μm. Thus, along any given direction in the plane of the large hexagonal area, each source and drain cell extends significantly less than 5% of the maximum extent of the large hexagonal area in that direction. Accordingly, arbitrary increases and decreases in current rating can be achieved by addition or subtraction of suitable numbers of cells.

There are several advantages to forming a lateral field effect transistor device from such a tessellated array of source and drain cells, including:

Scalability, and

Balanced current flow

More particularly, due to the repeating nature of cells, the size of the device can be scaled as required, to produce a device of as high a current rating as needed. In addition, plural such devices can be readily tessellated to increase the combined current rating of the devices. Further, a rotationally symmetric and uniform arrangement of cells, promotes a balanced current flow through the device, avoiding single points of failure.

Although hexagonal source and drain cells are particularly effective, other shaped cells are possible. For example, FIG. 3A-3B shows schematically variant forms 3A a drain cell 2, and 3B a source cell 1. The drain cell has a central semiconductor drain region 7 in the shape of a three-pointed star. This tessellates with a source cell which has a "dog-bone" shaped central semiconductor source region 6.

Depending upon the device requirements, different cell configurations and overall device shapes are possible. The embodiment of FIGS. 1 to 2A-2D has a central gate electrode pad G, with drain D and source S electrode pads alternating around the perimeter. However, changes to this layout are possible. Thus the electrodes can be selected to be source, drain or gate as required, and the pattern of the source and drain cells can be modified. For example, shows two interlocking spirals of source 1 and drain 2 cells forming an overall triangular tessellated area.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A lateral field effect transistor device having:
    a plurality of source cells and a plurality of drain cells, each source cell having a central semiconductor source region, and each drain cell having a central semiconductor drain region;
    a first metallic conductive path which extends from a source electrode to join the source regions of the source cells, thereby connecting the source cells in series to the source electrode, the first metallic conductive path comprising a main branch extending from the source electrode toward a gate electrode, and a plurality of side branches extending from the main branch;
    a second metallic conductive path which extends from a drain electrode to join the drain regions of the drain cells, thereby connecting the drain cells in series to the drain electrode, the second metallic conductive path comprising a main branch extending from the drain electrode toward the gate electrode, and a plurality of side branches extending from the main branch, wherein the side branches of the first and second metallic conductive paths travel across the cells to connect the semiconductor regions of neighbouring source cells and the semiconductor regions of neighbouring drain cells in respective series rows; and
    a gate path which extends from a gate electrode around the edges of the source cells to form boundaries between neighbouring source and drain cells, thereby forming respective field effect transistors between the source and drain regions of neighbouring cells, wherein the source cells and drain cells tessellate to cover a tessellated area of the device, and the gate path extends around the source cells without extending between neighbouring source cells.

2. A lateral field effect transistor device according to claim 1, wherein,
    along any given direction in the plane of the tessellated area of the device, each source and drain cell extends no further than 20% of the maximum extent of the tessellated area in that direction.

3. A lateral field effect transistor device according to claim 1, wherein,
    in the plane of the tessellated area of the device, the source and drain cells have an aspect ratio of no more than 5:1.

4. A lateral field effect transistor device according to claim 1, wherein,
    in the plane of the tessellated area of the device, the source and drain cells are shaped such that the gate path zig-zags around the edges of the cells.

5. A lateral field effect transistor device according to claim 1, wherein,
    in the plane of the tessellated area of the device, the source and drain cells are substantially hexagonal-shaped.

6. A lateral field effect transistor device according to claim 1, wherein
    the gate path is a buried gate path.

7. A lateral field effect transistor device according to claim 1, wherein
    each of the first and second conductive paths includes branched paths which connect their respective cells in multiple series rows to their respective electrode.

8. A lateral field effect transistor device according to claim 1, wherein
    the first and second conductive paths are metal paths.

9. A lateral field effect transistor device according to claim 1, wherein
    the first and second conductive paths are buried paths.

10. A lateral field effect transistor device according to claim 1 having plural first conductive paths which each extends from a respective source electrode to join the source regions of a respective portion of the source cells, and further having plural second conductive paths which each extends from a respective drain electrode to join the drain regions of a respective portion of the drain cells.

11. A lateral field effect transistor device according to claim 10, wherein
    plural gate paths extend from the gate electrode, each gate path forming boundaries between respective portions of the neighbouring source and drain cells.

12. A lateral field effect transistor device according to claim 11, wherein
    the source and drain electrodes are spaced around the boundary of the tessellated area, and the gate electrode is centrally positioned in the tessellated area.

13. A lateral field effect transistor device according to claim 12, wherein,
    in the plane of the tessellated area of the device, the source and drain cells are substantially hexagonal-shaped, and wherein the tessellated area is hexagonal-shaped.

14. A lateral field effect transistor device according to claim 1, which is a high electron mobility transistor device.

* * * * *